US007358740B2

(12) United States Patent
Davis et al.

(10) Patent No.: US 7,358,740 B2

(45) Date of Patent: Apr. 15, 2008

(54) THERMAL SWITCH WITH SELF-TEST FEATURE

(75) Inventors: George D. Davis, Bellevue, WA (US); Byron G. Scott, Arlington, WA (US)

(73) Assignee: Honeywell International Inc., Morristown, NJ (US)

( * ) Notice: Subject to any disclaimer, the term of this patent is extended or adjusted under 35 U.S.C. 154(b) by 315 days.

(21) Appl. No.: 10/907,086

(22) Filed: Mar. 18, 2005

(65) Prior Publication Data

US 2006/0208846 A1 Sep. 21, 2006

(51) Int. Cl.
*G01R 31/02* (2006.01)

(52) U.S. Cl. ........................................ 324/417; 337/14

(58) Field of Classification Search ................ 324/415, 324/417; 337/14

See application file for complete search history.

(56) References Cited

U.S. PATENT DOCUMENTS 3,947,758 A 3/1976 Sutton et al.
3,949,595 A 4/1976 Jones et al.
4,312,278 A 1/1982 Smith et al.
4,963,088 A 10/1990 Erdman
5,041,775 A 8/1991 Erdman
5,043,690 A * 8/1991 Wahls ........................ 337/370
5,074,780 A 12/1991 Erdman
5,076,780 A 12/1991 Erdman
5,838,878 A 11/1998 Jane et al.
6,244,113 B1 6/2001 Naumann
6,480,091 B1 * 11/2002 Scott et al. ................. 337/332
6,640,646 B2 11/2003 Davis et al.
6,707,372 B2 3/2004 Davis et al.
6,762,668 B2 7/2004 Davis et al.
6,768,412 B2 7/2004 Becka et al.
6,781,504 B2 8/2004 Scott et al.
2002/0060622 A1 5/2002 Scott et al.
2004/0047100 A1 3/2004 Davis et al.

* cited by examiner

*Primary Examiner*—Vincent Q. Nguyen
(74) *Attorney, Agent, or Firm*—Black Lowe & Graham PLLC

(57) ABSTRACT

A normally open thermal switch (200) having a bimetallic disk (18) is configured for operational testing in its installed position when exposed to a changing temperature by a test box (400) having a power source (400*a*). The in-place testing advantageously confirms triggering action of the switch by an event indicator (400*c*) at the operational temperatures designed into the switch (200). The temperature of the triggering action is presented on a temperature display (400*b*) and recorded by a data recorder (400*d*) of the test box (400). The switch (200) incorporates a heating element (24*c*) to heat changing the bimetallic disk (18) to snap activate at the operative temperatures. The thermal switch (200) is coupled with the test box (400) to confirm its operation without having to remove the switch from its installed location.

6 Claims, 7 Drawing Sheets

THERMAL SWITCH WITH SELF-TEST FEATURE

BACKGROUND OF THE INVENTION

Thermal switches are used in a variety of applications where it is desirable to activate and/or deactivate equipment as a function of sensed temperature. Such applications may include: rocket motors and thrusters, battery charge rate control, temperature control for fuel systems, environmental controls, overheat protection as well as many others. In several thermal switch applications, it is desirable to know when the switch has been activated and at what temperature. For example, it is desirable to know that the switch is functioning correctly when the switch is part of a safety system or is part of a control system used to protect equipment. Snap-action thermal switches are utilized in a number of applications, such as temperature control and overheat detection of mechanical devices such as motors and bearings. In some applications, multiple thermal switches are located at different positions around the equipment. For example, in some aircraft wing, fuselage, and cowling overheat detection applications, multiple thermal switches are located just behind the leading edge flap, while other thermal switches are spaced along the length of each wing. Additional thermal switches are located in the engine pylon and where the wing attaches to the fuselage. In this example, the multiple thermal switches are connected electrically in parallel, such that just two wires are used to interface between all of the switches on each wing and an instrument that monitors the temperature of the aircraft's wing, fuselage, and cowling.

Current snap-action thermal switch designs typically provide open and closed functions only. Typically, all of the thermal switches in the aircraft wing, fuselage, and cowling overheat detection applications are operated in the normally open state. The thermal switches are thus all in the "open" state until an overheat condition is detected, at which time one or more of the switches change to the "closed" state, thereby completing the circuit causing a "right wing," "left wing" or "fuselage" overheat indication to appear in the cockpit. The pilot then follows the appropriate procedure to reduce the overheat condition.

Current snap-action thermal switches used in parallel operation, multiple thermal switch overheat detection systems suffer from various drawbacks. The integrity of the wire harness between the cockpit and the wing tip cannot be assured because the circuit is always open under normal operating conditions. If a switch connector is not engaged or the wire harness contains a broken lead wire, a malfunction indication will not occur, but neither will the overheat detection system operate during an actual in-flight overheat condition. Furthermore, if an overheat condition does occur, current snap-action thermal switches are not equipped to provide information describing the exact location of the overheat. In both instances, flight safety is compromised, and later correction of the problem that caused the overheat condition is made more difficult because of the inability to pinpoint the overheat fault.

One application for thermal switches that clearly illustrates the disadvantages of prior art devices is duct leak overheat detection systems. The duct leak overheat detection system is part of the aircraft deicing system. In this type of deicing system, hot air is forced pneumatically through a tube along the leading edge of the wing. Thermal switches located along this duct, indicate overheating, which could otherwise lead to structure failure and other system failures. When a thermal switch is tripped, a light illuminates in the cockpit indicating a "right" or "left" wing overheat condition. If, after shutting the system down on the appropriate wing, the switch does not reset, the airplane must divert to an emergency landing. Upon landing, the airplane maintenance personnel have no way of knowing which particular switch has been activated, because there exist multiple thermal switches linked to a particular cockpit light. The existing airplane systems have only provided the crew with an indication of the particular wing semispan along which a thermal switch was tripped. If the switch has reset, there is no indication to the maintenance personnel that it was tripped by the overheat condition. This dearth of information requires the crew to physically access and inspect the entire system along the appropriate wing semispan. Even in applications where only one temperature probe indicated an alarm temperature in-flight, extensive and expensive troubleshooting is sometimes necessary. For example, an airborne alert from a temperature probe in aircraft turbine bleed air ductwork may require engine run-up and monitoring on the ground to determine whether the probe and/or the bleed air system is faulty.

SUMMARY OF THE EMBODIMENTS

Embodiments provide a thermal switch test system that provides a ready indication that the thermal switch has experienced temperatures that triggered operation of the switch. Particular embodiments include a thermal switch with a heating element and a test box that is able to be coupled to the thermal switch at the installed position of the thermal switch so that temperature responsive actuator testing of the thermal switch may be conducted in situ, i.e., at the installed position of the thermal switch. The in situ testing of the thermal switch permits the advantageous testing without incurring the cost and inconvenience of thermal switch removal.

A particular embodiment includes a thermal switch having two pairs of four contacts in communication with a test box having an electrical power source, a temperature display, an event indicator, and a data recorder. The event indicator and temperature display communicates with the data recorder.

BRIEF DESCRIPTION OF THE DRAWINGS

The preferred and alternative embodiments of the present invention are described in detail below with reference to the following drawings.

DETAILED DESCRIPTION OF THE PREFERRED EMBODIMENT

Figure 1:
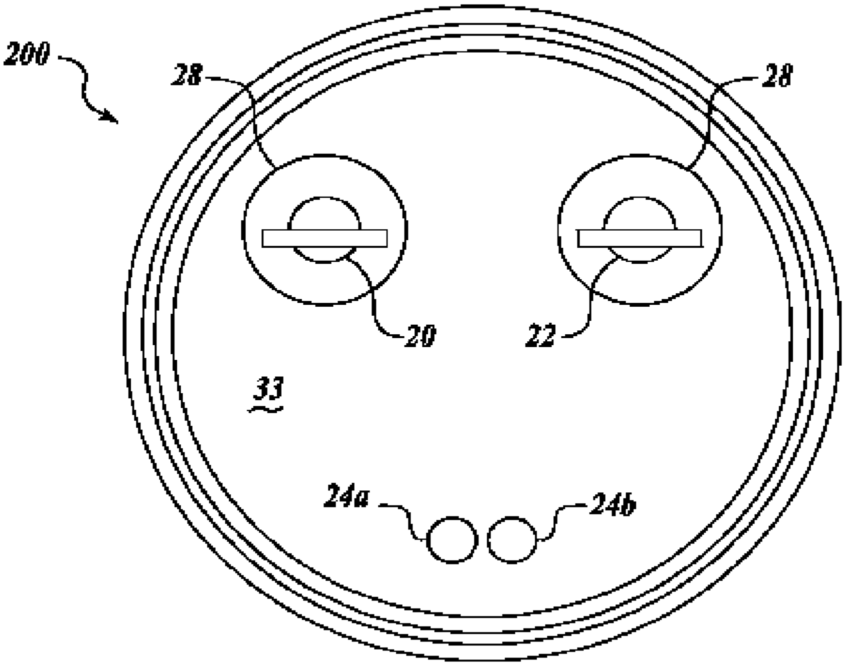
FIG. 1 is a top plan view of one alternative embodiment of the thermal switch with self-test feature embodied as a snap-action thermal switch having leads to a heating element.
Figure 2:
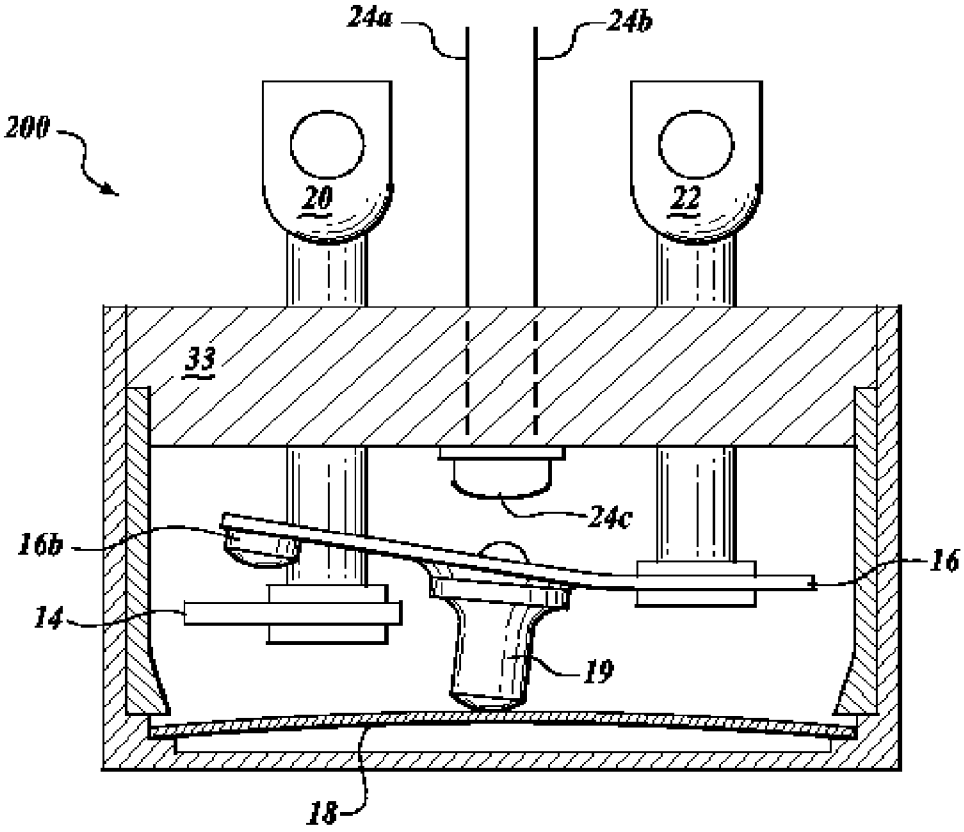
FIG. 2 is a cross-sectional side view of the snap-action thermal switch with self-test feature showing the leads coupled with the heating element.

FIG. 1 is a top plan view of one embodiment of a thermal switch 200 embodied as a snap-action thermal switch having leads to a heating element. FIG. 2 is a cross-sectional side view of the snap-action thermal switch 200 showing the leads coupled with the heating element. The thermal switch 200 depicted in FIGS. 1 and 2 is configured in a normally open position. A switch configuration that is normally in the closed is also within the scope of this one embodiment. The thermal switch 200 has two additional leads 24*a* and 24*b* which are electrically isolated from a header 33. The leads 24*a* and 24*b* are coupled to a heating element 24*c*. Circumscribing the terminals 20 and 22 are glass insulators 28. The insulators 28 separate the terminals 20, 22 from the header 33.

The thermal switch 200 includes a pair of electrical contacts 14, 16*b* that are mounted on the ends of a pair of spaced-apart, electrically conductive terminals 20 and 22. The electrical contacts 14, 16*b* are moveable relative to one another between an open and a closed state under the control of a thermally responsive actuator 18. The contact 16*b* is moveable via an armature spring 16. The spring 16 is attached to the terminal 22. The contact 14 is non-moveable or fixed. When the contact 16*b* touches the contact 14, a closed circuit exists. Whenever the contact 16*b* is spaced from or otherwise does not touch the contact 14, an open circuit exists.

According to one embodiment of the invention, the thermally responsive actuator 18 is a snap-action bimetallic disc that inverts with a snap-action as a function of a predetermined temperature between two bi-stable oppositely concave and convex states. The movement of the actuator 18 is conveyed to the moveable contact 16*b* via an intermediary striker pin 19. The striker pin 19 is configured to transfer force or otherwise engage with the actuator 18 and the armature spring 16. It also provides electrical isolation beneath the switch and the expandable case.

In a first state, the bimetallic disc actuator 18 is convex relative to the relatively moveable electrical contacts 14, 16*b*, whereby the electrical contacts 14, 16*b* are moved apart such that they form an open circuit. In a second state, the bimetallic disc actuator 18 is concave relative to the relatively moveable electrical contacts 14, 16*b*, whereby the electrical contacts 14, 16*b* are moved together such that they form a closed circuit.

Figure 3:
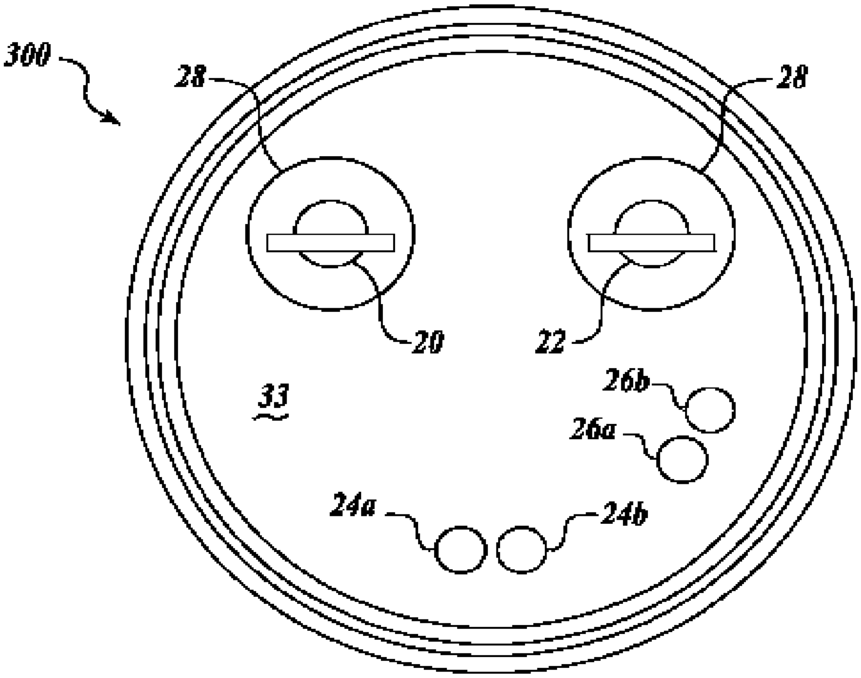
FIG. 3 is a top plan view of another alternative embodiment of the thermal switch with self-test feature embodied as a snap-action thermal switch having leads to a heating element and leads to a temperature sensing thermalcouple.
Figure 4:
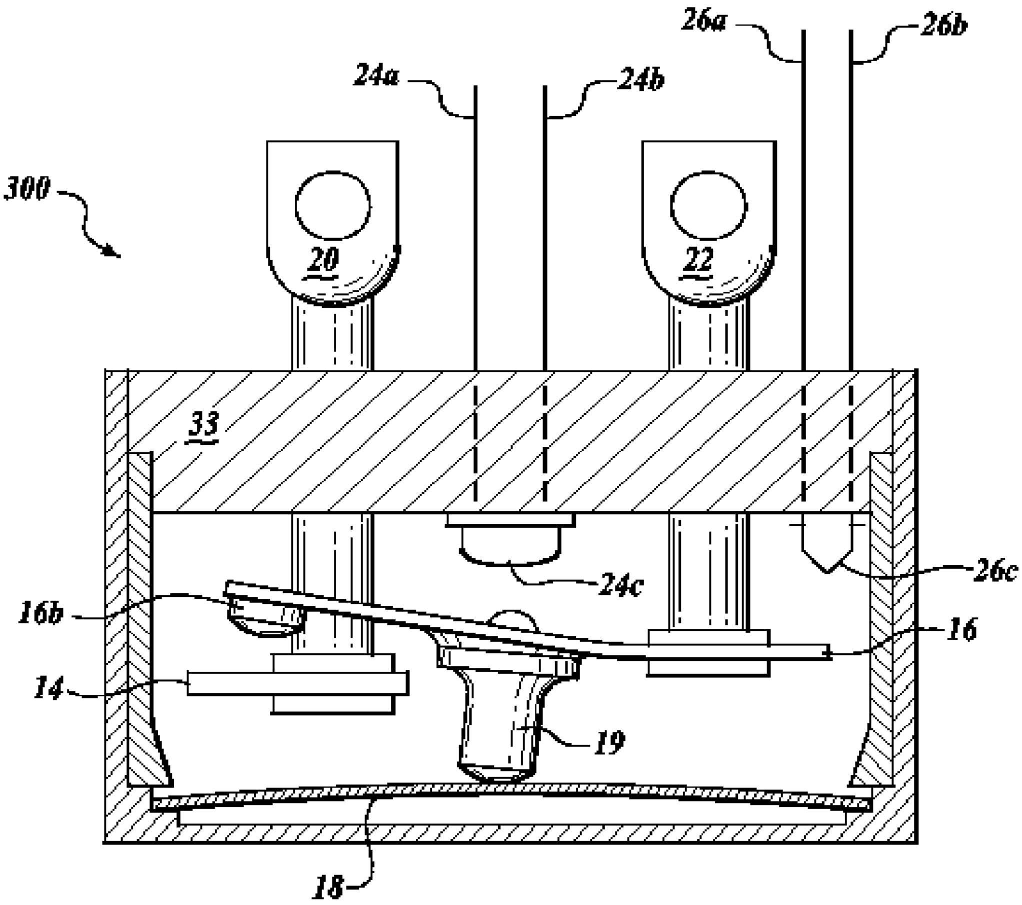
FIG. 4 is a cross-sectional side view of the snap-action thermal switch with self-test feature showing the leads coupled with the heating element and leads to the temperature sensing thermalcouple.

FIG. 3 is a top plan view of one alternative embodiment of a thermal switch 300 having leads 24*a* and 24*b* to a heating element 24*c* and leads 26*a* and 26*b* to a temperature sensor 26*c*. FIG. 4 is a cross-sectional side view of the snap-action thermal switch 300 showing the leads 24*a* and 25*b* coupled with the heating element 24*c* and the leads 26*a* and 26*b* coupled with temperature sensor 26*c*. The thermal switch 300 depicted in FIGS. 3 and 4 is configured in a normally open position, but can be implemented in a normally closed position. Circumscribing the terminals 20 and 22 are glass insulators 28. The insulators 28 separate the terminals 20, 22 from the header 33.

Figure 5:
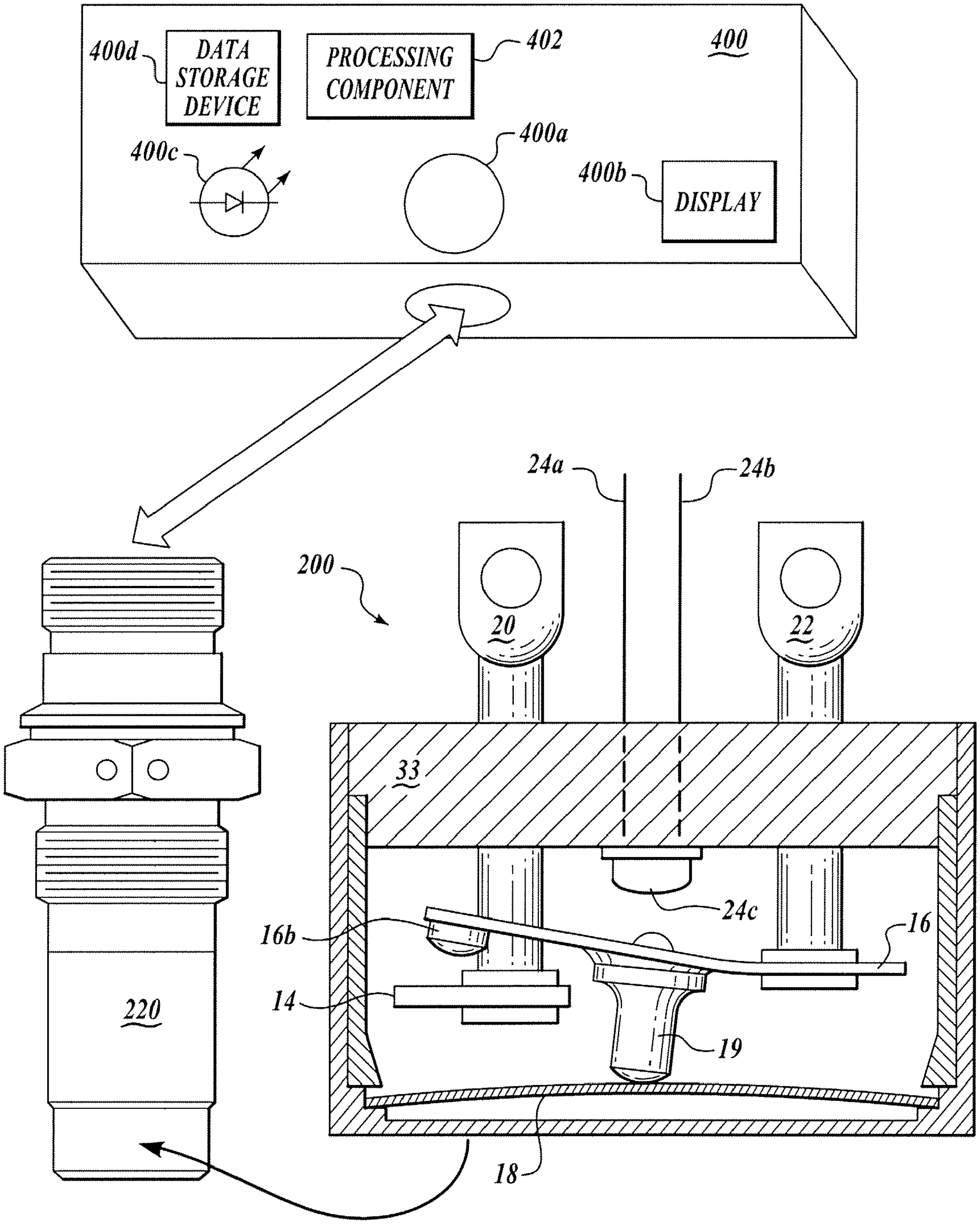
FIG. 5 is a pictorial presentation of one test box embodiment coupled with a housing having one embodiment of thermal switch with self-test feature.

FIG. 5 is a pictorial presentation of one test box 400 for use with the thermal switch 200 shown in FIGS. 1 and 2. The thermal switch 200 is included in a housing 220. In one embodiment, the test box 400 includes a female coupling with ports that connect to pins in the housing 220 that electrically connect to the leads 24*a* and 24*b* and to the posts 20 and 22. A wire harness or other cabling means may serve to connect the test box 400 to the installed housing 220. For example, the thermal switch 200 is fixed within the housing 220 that in turn is installed in a bleed air duct of an aircraft. In one embodiment, the test box 400 includes a power source 400*a* (such as an adjustable power source), a display 400*b*, an event indicator 400*c*, a data storage device 400*d*, and a processing component 402. The processing component 402 is coupled to the power source 400*a*, the display 400*b*, the event indicator 400*c*, and the data storage device 400*d*. The processing component 402 may be a microprocessor configured to process temperature-related and time-related signals associated with the operational status of the thermal switch 200. This is described in more detail below in FIG. 6.

Figure 6:
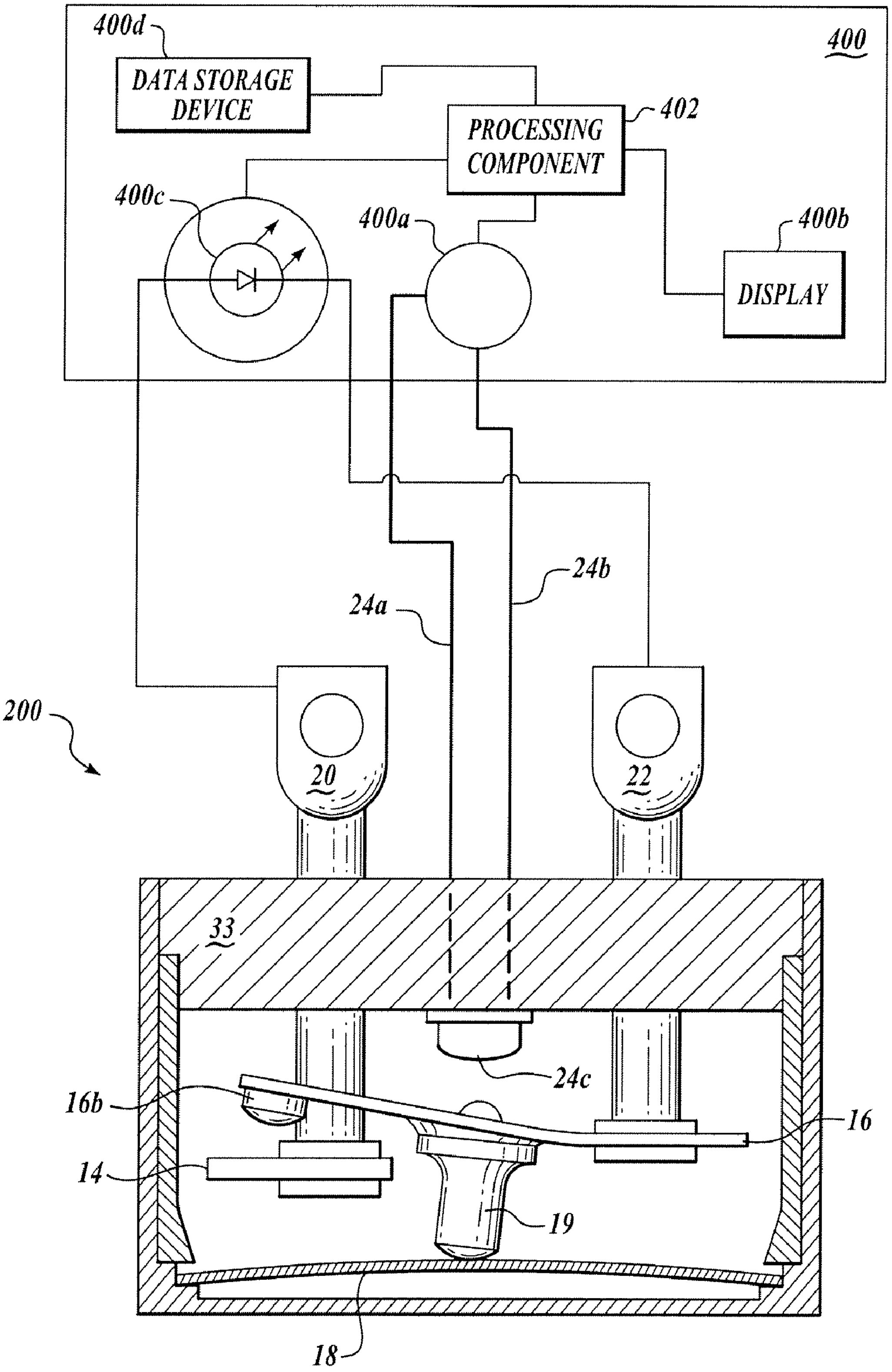
FIG. 6 is a pictorial presentation of another test box coupled with a housing having another embodiment of thermal switch with self-test feature.

FIG. 6 is a pictorial presentation of a coupling schematic of the test box 400. The test box 400 is designed to display a signal indicating a change of contact status between the leads 20, 22. The change in contact status may be from a normally open position to a closed position, or a normally closed position to an open position between the leads 20, 22. The test box 400 also displays the temperatures at which the change in contact status occurred.

A power source 400*a* controlled by a processing component 402 delivers electrical current to the heating element 24*c* via the leads 24*a*, 24*b*. The power source 400*a* can be adjustable via a mechanically turnable knob, adjusted by keyboard entry or by some other means. Depending on the electrical power delivered to the heating element 24*c* and duration of the delivered power, a temperature value is determined by the processing component 402 and sent to the display 400*b* for presentation. The temperature value includes a movement-generating temperature that causes the actuator to move. For example, when the actuator is in the form of a bimetallic disk 18, the bimetallic disk 18 snaps or toggles. The snapping of the bimetallic disk 18 causes the contact 16*b* to close and touch the fixed contact 14. A current signal is then sent via the terminals 20, 22 to the event indicator 400*c* and an event is signaled by the indicator 400*c* either visually or audibly. The processing component 402 records the temperature value of the movement-generating temperature at the time the switch 200 toggles and stores it in the storage device 400*d*. The test box 400 may be wirelessly or hard-wire linked to another device for extracting the information recorded on the storage device 400*d*.

Figure 7:
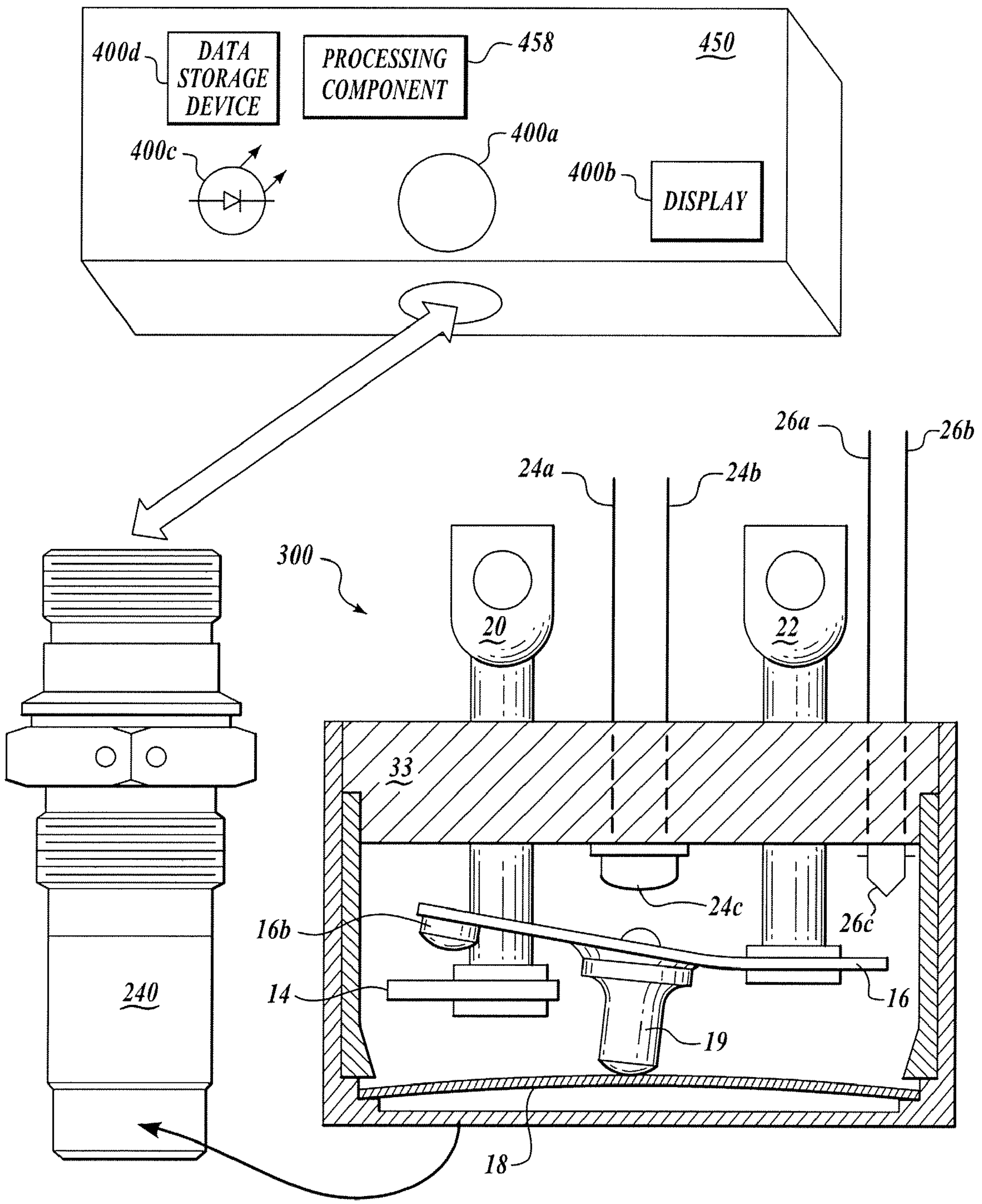
FIG. 7 is a pictorial presentation of a coupling schematic of the one test box embodiment coupled with one embodiment of the thermal switch with self-test feature.

FIG. 7 is a pictorial presentation of another test box 450 for use with the thermal switch 300 shown in FIGS. 3 and 4. The thermal switch 300 is included in a housing 240. In one embodiment, the test box 450 includes a female coupling with ports that connect to the pins in the housing 240 that electrically connect to the leads 24*a* and 24*b*, and 26*a* and 26*b* and to the posts 20 and 22. A wire harness or other cabling means may serve to connect the test box 450 to the installed housing 240. For example, the thermal switch 300 is fixed within the housing 240 that in turn is installed in a bleed air duct of an aircraft. The test box 450 similarly includes the multiple components of the test box 400 but configured differently as described below in FIG. 8.

Figure 8:
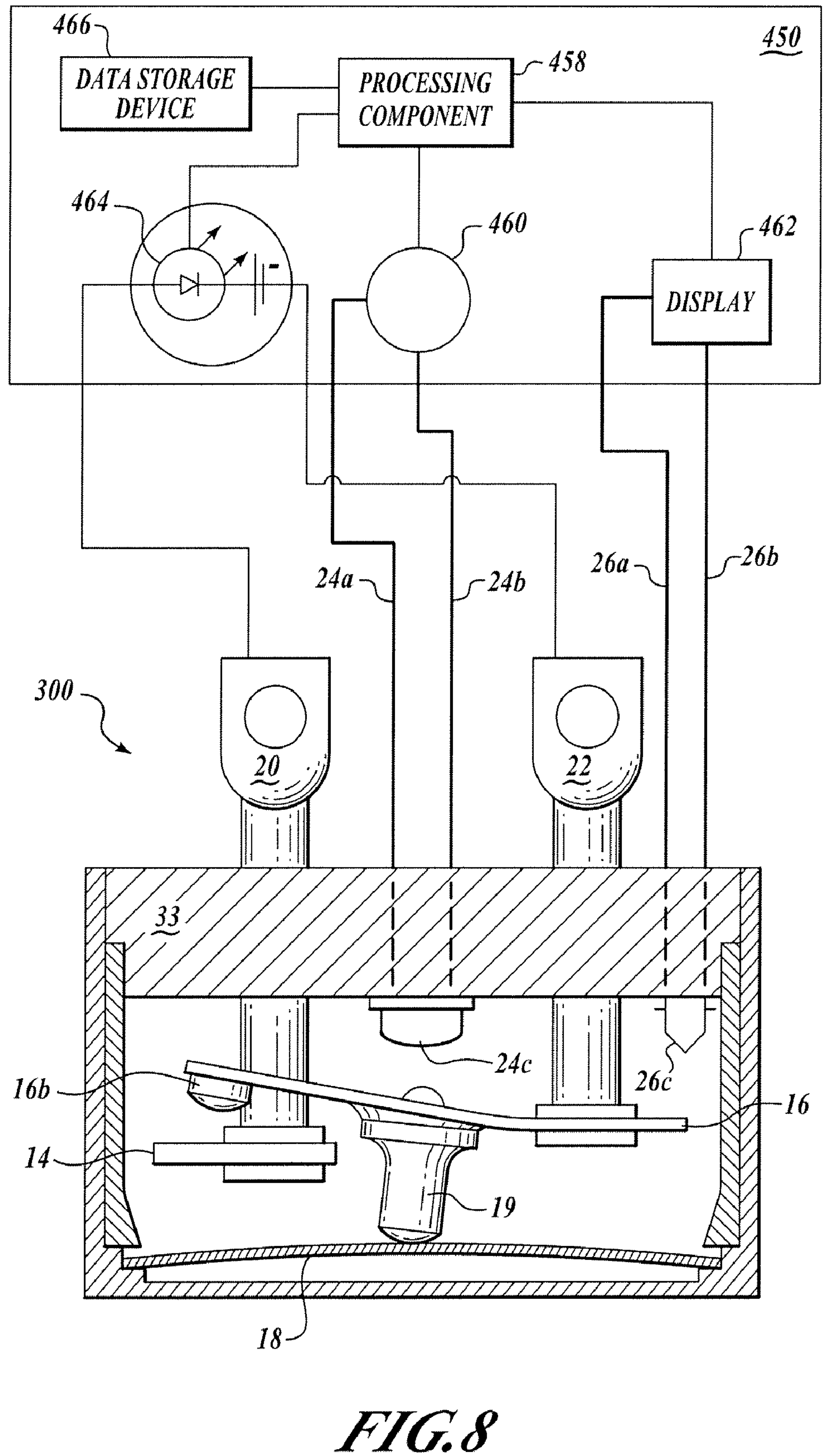
FIG. 8 is a pictorial presentation of another coupling schematic of the other test box embodiment coupled with another embodiment of thermal switch with self-test feature.

FIG. 8 is a pictorial presentation of a coupling schematic of the test box 450 with the thermal switch 300. Similar to the test box 400, the test box 450 is designed to display a signal indicating a change of contact status between the leads 20, 22. The change in contact status may be from a normally open position to a closed position, or a normally closed position to an open position between the leads 20, 22. The test box 450 also displays the temperatures at which the change in contact status occurred.

The test box 450 includes a processing component 458 coupled to a power source 460, a display 462, an indicator 464, and a storage device 466. The power source 460 as controlled by the processing component 458 delivers electrical current to the heating element 24*c* via the leads 24*a*, 24*b*. The power source 460 can be adjustable via a mechanically turnable knob, adjusted by keyboard entry or by some other means. The actual temperature experienced within the internal spacing of the thermal switch 300 is measured by the temperature sensor 26*c*. The processing component 458 instructs the display 462 to present the measured temperature. When the bimetallic disk 18 snaps, the contact 16*b* closes and touches the plate 14. A current signal is then sent via the leads posts 20, 22 to the indicator 464 and the event is signaled by the indicator 464 either visually or audibly. The processing component 458 records the temperature value at the time the switch 300 toggles and stores it in the storage device 466. The test box 450 may be wirelessly or hard-wire linked to another device for extracting the information recorded on the storage device 466.

Figure 9:
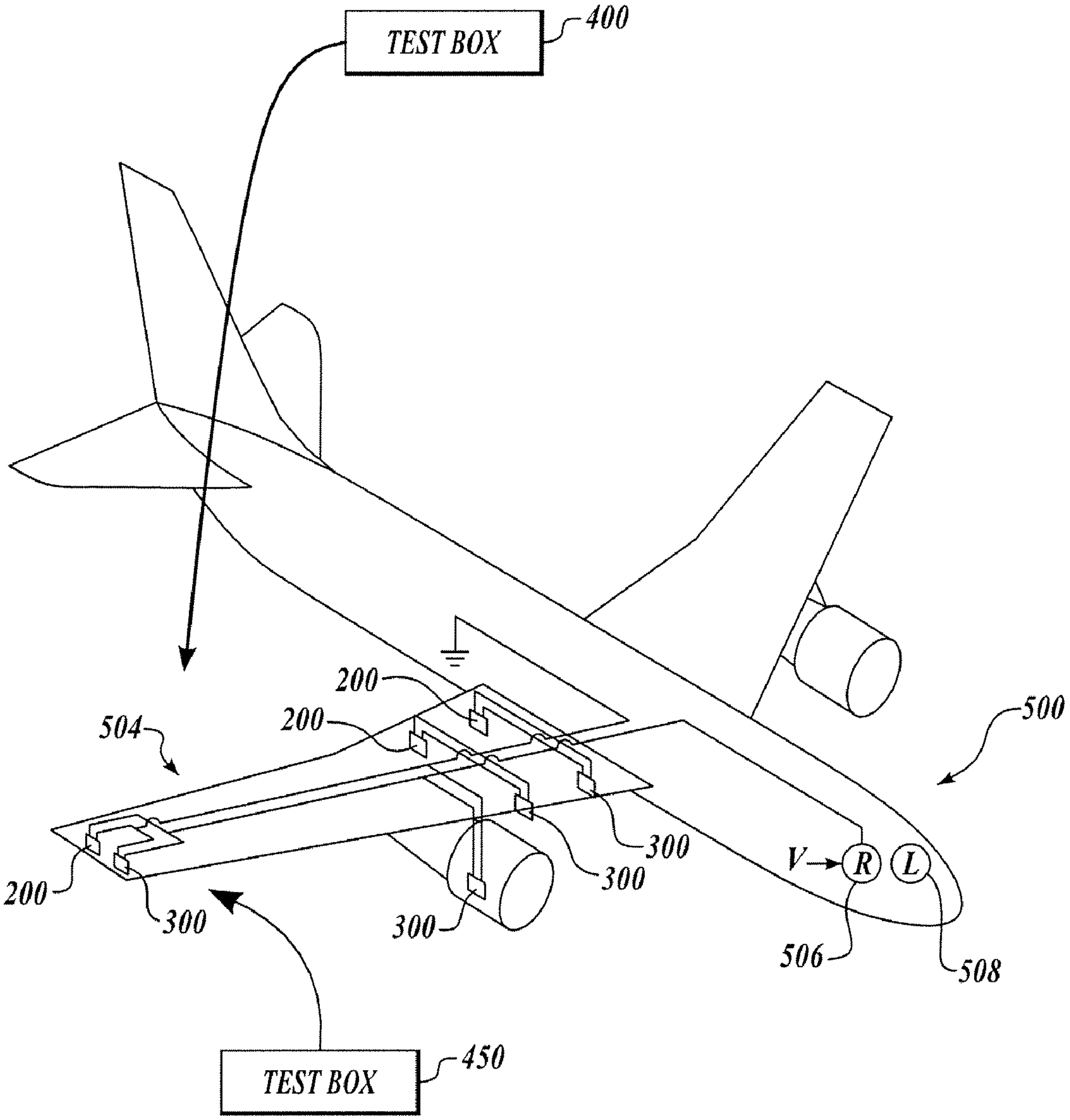
FIG. 9 is a pictorial presentation of the one and another test box embodiments ready for coupling to installed one and other embodiments of the thermal switch with self-test features located on an aircraft.

FIG. 9 is a pictorial presentation of the test boxes 400 and 450 for use of the thermal switches 200 and 300 on an aircraft. An aircraft 500 is shown with a distribution of installed thermal switches 200 and 300 within a wing structure 504. For example, multiple switches 200 are installed on the aft section of the 504 and multiple switches 300 are installed on a forward section of the wing 504. The in situ or in-place testing of the installed switches 200 is achieved via the coupling and operation of the test box 400. Similarly, the in situ or in-place testing of the installed switches 300 is achieved via the coupling and operation of the test box 450.

The aircraft 500 includes left (L) and right (R) cockpit indicators 506 and 508. The cockpit indicators 506 and 508 indicate when the switches 200 and 300 in the respective wing (left or right) have toggled. The test boxes 400 and 450 may be coupled to the respective cockpit indicator 506 and 508 at the cable end that is connected to the switch housing 220 or 240. When cockpit lights are respectively on or off in accord with the event indicator 400*c* or 464, then the operational integrity between the thermal switches 200, 300 and the cockpit indicators 506 or 508 is good. In the event the cockpit indicators do not light in accord with a signal sent from the event indicator 400*c* or 464 then the connection of the cabling between the cockpit indicators 506 or 508 and the switches 200, 300 is bad.

While the preferred embodiment of the invention has been illustrated and described, as noted above, many changes can be made without departing from the spirit and scope of the invention. For example, the test box 400 or the test box 450 may be configured without a processing component. In these test boxes the confirmation that the thermal switch operates as intended, that is, proving that a change in contact status between the leads 20, 22 has occurred at actuator movement-generating temperatures, is verified by a user directly viewing the event indicator at the moment of actuator movement or reviewing the event signal data stored by the data recorder.

Accordingly, the scope of the invention is not limited by the disclosure of the preferred embodiment. Instead, the invention should be determined entirely by reference to the claims that follow.

What is claimed is:

1. A thermal switch testing system for detecting switch operation, comprising:
- a housing;
- a heating element disposed within the housing;
- a switch device disposed within the housing;
- a temperature sensing element;
- a test box coupled with the switch device and the heating element, the test box comprising:
  - a heater component for causing the heating element to apply heat within the housing;
  - a sensing component for sensing when the switch device toggles,
  - a component coupled to the temperature sensing element and the sensing component for determining a temperature within the housing at which the switch device toggled; and
  - a display for displaying the determined temperature.

2. The system of claim 1, wherein the switch device includes a bimetallic disk.

3. The system of claim 1, wherein the test box further includes an event indicator configured to indicate when the switch device toggles.

4. The system of claim 3, wherein toggling of the switch device includes at least one of going from a closed position to an open position or going from an open position to a closed position.

5. The system of claim 1, wherein the test box further includes a storage device for storing the determined temperature.

6. The system of claim 1, wherein the test box is coupled to the thermal switch at a thermal switch installed position.

* * * * *